(12) United States Patent
Ishikawa et al.

(10) Patent No.: US 8,568,529 B2
(45) Date of Patent: Oct. 29, 2013

(54) HVPE CHAMBER HARDWARE

(75) Inventors: Tetsuya Ishikawa, Saratoga, CA (US);
David H. Quach, San Jose, CA (US);
Anzhong Chang, San Jose, CA (US);
Olga Kryliouk, Sunnyvale, CA (US);
Yuriy Melnik, Santa Clara, CA (US);
Harsukhdeep S. Ratia, Santa Clara, CA (US); Son T. Nguyen, San Jose, CA (US); Lily Pang, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 979 days.

(21) Appl. No.: 12/637,019

(22) Filed: Dec. 14, 2009

(65) Prior Publication Data

US 2010/0258049 A1    Oct. 14, 2010

Related U.S. Application Data

(60) Provisional application No. 61/168,399, filed on Apr. 10, 2009, provisional application No. 61/172,630, filed on Apr. 24, 2009, provisional application No. 61/230,877, filed on Aug. 3, 2009.

(51) Int. Cl.
*C30B 21/02* (2006.01)

(52) U.S. Cl.
USPC .............. 117/86; 117/100; 117/104; 117/105

(58) Field of Classification Search
USPC .................... 117/86, 100, 104, 105
See application file for complete search history.

(56) References Cited

U.S. PATENT DOCUMENTS

| | | |
|---|---|---|
| 3,063,867 A | 11/1962 | Emery, Jr |
| 4,851,295 A | 7/1989 | Brors |
| D329,839 S | 9/1992 | Ehrhart |
| 5,273,588 A | 12/1993 | Foster et al. |
| 5,348,911 A | 9/1994 | Jurgensen et al. |
| 5,359,788 A | 11/1994 | Gell, Jr. |
| 5,636,320 A | 6/1997 | Yu et al. |
| 5,647,911 A | 7/1997 | Vanell et al. |
| 5,667,592 A | 9/1997 | Boitnott et al. |

(Continued)

FOREIGN PATENT DOCUMENTS

| | | |
|---|---|---|
| CN | 1423834 A | 6/2003 |
| JP | 2004-140328 A | 5/2004 |

(Continued)

OTHER PUBLICATIONS

Office Action, U.S. Appl. No. 11/925,615 dated Nov. 19, 2010.

(Continued)

*Primary Examiner* — Bob M Kunemund
(74) *Attorney, Agent, or Firm* — Patterson & Sheridan, LLP

(57) ABSTRACT

Embodiments disclosed herein generally relate to an HVPE chamber. The chamber may have two separate precursor sources coupled thereto to permit two separate layers to be deposited. For example, a gallium source and a separate aluminum source may be coupled to the processing chamber to permit gallium nitride and aluminum nitride to be separately deposited onto a substrate in the same processing chamber. The nitrogen may be introduced to the processing chamber at a separate location from the gallium and the aluminum and at a lower temperature. The different temperatures causes the gases to mix together, react and deposit on the substrate with little or no deposition on the chamber walls.

11 Claims, 9 Drawing Sheets

(56) References Cited

U.S. PATENT DOCUMENTS

| | | |
|---|---|---|
| 5,715,361 A | 2/1998 | Moslehi |
| 5,762,755 A | 6/1998 | McNeilly et al. |
| 5,814,239 A | 9/1998 | Kaneko et al. |
| 5,855,675 A | 1/1999 | Doering et al. |
| 5,858,471 A | 1/1999 | Ray et al. |
| 5,871,586 A | 2/1999 | Crawley et al. |
| 6,086,673 A | 7/2000 | Molnar |
| 6,156,581 A | 12/2000 | Vaudo et al. |
| 6,179,913 B1 | 1/2001 | Solomon et al. |
| 6,200,893 B1 | 3/2001 | Sneh |
| 6,206,972 B1 | 3/2001 | Dunham |
| 6,270,569 B1 | 8/2001 | Shibata et al. |
| 6,274,495 B1 | 8/2001 | Omstead et al. |
| 6,286,451 B1 | 9/2001 | Ishikawa et al. |
| 6,305,314 B1 | 10/2001 | Sneh et al. |
| 6,309,465 B1 | 10/2001 | Jurgensen et al. |
| 6,355,107 B1 | 3/2002 | Solomon et al. |
| 6,451,119 B2 | 9/2002 | Sneh et al. |
| 6,451,695 B2 | 9/2002 | Sneh |
| 6,451,713 B1 | 9/2002 | Tay et al. |
| 6,464,843 B1 | 10/2002 | Wicker et al. |
| 6,475,910 B1 | 11/2002 | Sneh |
| 6,503,330 B1 | 1/2003 | Sneh et al. |
| 6,508,197 B1 | 1/2003 | Omstead et al. |
| 6,517,634 B2 | 2/2003 | Pang et al. |
| 6,528,394 B1 | 3/2003 | Lee et al. |
| 6,533,874 B1 | 3/2003 | Vaudo et al. |
| 6,540,838 B2 | 4/2003 | Sneh et al. |
| 6,551,399 B1 | 4/2003 | Sneh et al. |
| 6,562,720 B2 | 5/2003 | Thilderkvist et al. |
| 6,562,730 B2 | 5/2003 | Jeng et al. |
| 6,569,765 B1 | 5/2003 | Solomon et al. |
| 6,602,784 B2 | 8/2003 | Sneh |
| 6,616,766 B2 | 9/2003 | Dunham |
| 6,616,870 B1 | 9/2003 | Goela et al. |
| 6,630,401 B2 | 10/2003 | Sneh |
| 6,638,859 B2 | 10/2003 | Sneh et al. |
| 6,638,862 B2 | 10/2003 | Sneh |
| 6,648,966 B2 | 11/2003 | Maruska et al. |
| 6,660,083 B2 | 12/2003 | Tsvetkov et al. |
| 6,733,591 B2 | 5/2004 | Anderson |
| 6,849,241 B2 | 2/2005 | Dauelsberg et al. |
| 6,897,119 B1 | 5/2005 | Sneh et al. |
| 6,902,990 B2 | 6/2005 | Gottfried et al. |
| 6,905,547 B1 | 6/2005 | Londergan et al. |
| 6,921,437 B1 | 7/2005 | DeDontney et al. |
| 6,927,426 B2 | 8/2005 | Matsuoka et al. |
| 6,962,624 B2 | 11/2005 | Jurgensen et al. |
| 6,964,876 B2 | 11/2005 | Heuken |
| 6,969,426 B1 * | 11/2005 | Bliss et al. ............ 117/104 |
| 6,972,050 B2 | 12/2005 | Bremser et al. |
| 6,983,620 B2 | 1/2006 | Kaeppeler |
| 7,018,940 B2 | 3/2006 | Dunham |
| 7,033,921 B2 | 4/2006 | Jurgensen |
| 7,078,318 B2 | 7/2006 | Jurgensen et al. |
| 7,115,896 B2 | 10/2006 | Guo et al. |
| 7,128,785 B2 | 10/2006 | Kaeppeler et al. |
| 7,147,718 B2 | 12/2006 | Jurgensen et al. |
| 7,170,095 B2 | 1/2007 | Vaudo et al. |
| 7,364,991 B2 | 4/2008 | Bour et al. |
| 7,368,368 B2 | 5/2008 | Emerson |
| 7,438,761 B2 * | 10/2008 | Shibata et al. ............ 117/91 |
| 7,527,742 B2 | 5/2009 | Tysoe et al. |
| 7,556,688 B2 * | 7/2009 | Melnik et al. ............ 117/99 |
| 7,625,448 B2 | 12/2009 | Dauelsberg et al. |
| 7,682,940 B2 | 3/2010 | Ye et al. |
| 7,816,764 B2 * | 10/2010 | Marchand et al. ............ 257/613 |
| 8,092,597 B2 * | 1/2012 | Dmitriev et al. ............ 117/99 |
| 2001/0050059 A1 | 12/2001 | Hongo et al. |
| 2002/0164423 A1 | 11/2002 | Chiang et al. |
| 2004/0221809 A1 | 11/2004 | Ohmi et al. |
| 2006/0021568 A1 | 2/2006 | Matsumoto |
| 2006/0154455 A1 | 7/2006 | Guo et al. |
| 2006/0162661 A1 | 7/2006 | Jung et al. |
| 2006/0205199 A1 | 9/2006 | Baker et al. |
| 2007/0010033 A1 | 1/2007 | Aderhold et al. |
| 2007/0259502 A1 | 11/2007 | Bour et al. |
| 2008/0050889 A1 | 2/2008 | Bour et al. |
| 2008/0206464 A1 | 8/2008 | Kappeler |
| 2009/0149008 A1 | 6/2009 | Kryliouk et al. |
| 2009/0194026 A1 | 8/2009 | Burrows et al. |

FOREIGN PATENT DOCUMENTS

| | | |
|---|---|---|
| JP | 2007-039272 A | 2/2007 |
| JP | 2007-154297 A | 6/2007 |
| JP | D1304483 | 6/2007 |
| JP | 2008-066490 A | 3/2008 |
| JP | D1361441 | 6/2009 |
| KR | 10-0578089 B1 | 5/2006 |
| TW | 555877 B | 10/2003 |
| WO | WO-2009099721 A2 | 8/2009 |

OTHER PUBLICATIONS

Motoki, et al. "Preparation of Large Freestanding GaN Substrates by Hydride Vapor Phase Epitaxy Using GaAs as a Starting Substrate", JP Appl. Phys. vol. 40 (2001) pp. L140-L143. Part 2. No. 2B. Feb. 15, 2001.

Kikuchi, et al. "Thermodynamic Analysis of Various Types of Hydride Vapor Phase Epitaxy System for High-Speed Growth of InN", 2006, Japanese Journal of Appiled Physics, vol. 45 No. 45, pp. L1203-L1205.

Kelly, et al. "Large Free-Standing GaN Substrates by Hydride Vapor Phase Epitaxy and Laser-Induced Liftoff", JP Appl. Phys. vol. 38 (1999) pp. L217-L219. Part 2. No, 3A. Mar. 1, 1999.

Park, et al. "Free-Standing GaN Substrates by Hydride Vapor Phase Epitaxy", JP Appl. Phys. vol. 39 (2000) pp. L1141-L1142. Part 2. No. 11B. Nov. 15, 2000.

Ban, Vladimir S. "Mass Spectrometric Studies of Vapor-Phase Crystal Growth", vol. 119, Issue 6. pp. 761-765. Jun. 1972.

Office Action, U.S. Appl. No. 11/767,520 dated Sep. 8, 2010.

International Search Report, PCT/US2010/032032 dated Nov. 26, 2010.

Chinese Office Action for Application No. 200810168234.1, dated Aug. 16, 2010.

Bohnen, et al, "Enhanced Growth Rates and Reduced Parasitic Deposition by the Substitution of $Cl_2$ for HCl in GaN HVPE", Journal of Crystal Growth 312 (2010) 2542-2550.

International Search Report, PCT/US2010/032313, dated Dec. 6, 2010.

International search report and written opinion for PCT/US2010/030492 dated Oct. 27, 2010.

International search report and written opinion for PCT/US2010/030496 dated Oct. 27, 2010.

International search report and written opinion for PCT/US2010/032597 dated Dec. 1, 2010.

Office action for Taiwan patent application No. 099301936 dated Sep. 27, 2010.

* cited by examiner

HVPE CHAMBER HARDWARE

CROSS-REFERENCE TO RELATED APPLICATIONS

This application claims benefit of U.S. Provisional Patent Application Ser. No. 61/168,399, filed Apr. 10, 2009. This application also claims benefit of U.S. Provisional Patent Application Ser. No. 61/172,630, filed Apr. 24, 2009. This application also claims benefit of U.S. Provisional Patent Application Ser. No. 61/230,877, filed Aug. 3, 2009. Each of the aforementioned patent applications is herein incorporated by reference.

BACKGROUND OF THE INVENTION

1. Field of the Invention

Embodiments disclosed herein generally relate to a hydride vapor phase epitaxy (HVPE) chamber.

2. Description of the Related Art

Group-III nitride semiconductors are finding greater importance in the development and fabrication of short wavelength light emitting diodes (LEDs), laser diodes (LDs), and electronic devices including high power, high frequency, and high temperature transistors and integrated circuits. One method that has been used to deposit Group-III nitrides is HVPE. In HVPE, a hydride gas reacts with the Group-III metal which then reacts with a nitrogen precursor to form the Group-III metal nitride.

As the demand for LEDs, LDs, transistors, and integrated circuits increases, the efficiency of depositing the Group-III metal nitride takes on greater importance. Therefore, there is a need in the art for an improved HVPE deposition method and an HVPE apparatus.

SUMMARY OF THE INVENTION

Embodiments disclosed herein generally relate to an HVPE chamber. The chamber may have one or more precursor sources coupled thereto. When two separate precursor sources are coupled thereto, two separate layers may be deposited. For example, a gallium source and a separate aluminum source may be coupled to the processing chamber to permit gallium nitride and aluminum nitride to be separately deposited onto a substrate in the same processing chamber. In one embodiment, five precursor sources may be coupled to the chamber. Such precursor sources are capable of dispensing precursors such as gallium, indium, aluminum, silicon, and magnesium. When the precursors are used to form a nitrogen containing compound, a nitrogen containing gas such as $NH_3$ may be used. The nitrogen may be introduced to the processing chamber at a separate location from the precursors and at a lower temperature. The geometry of the chamber may be set such that the precursor and the reactive gas are introduced to the chamber separately to avoid high concentration mixing. The chamber inertia is designed to mix the gases by flow, diffusion and convection. In one embodiment, the different temperatures cause the gases to mix together, react and deposit on the substrate with little or no deposition on the chamber walls.

In one embodiment, an apparatus includes a chamber body having chamber walls, a reactive product boat coupled to the chamber body, a first reactive product source disposed within the reactive product boat and a second reactive source disposed within the reactive product boat. The apparatus may also include a first resistive heater coupled to the reactive product boat, a third reactive source coupled to the chamber body and disposed outside of the reactive product boat, a second resistive heater embedded within the chamber walls and a gas distribution showerhead disposed within the chamber body and coupled with the third reactive source. The apparatus may also include a susceptor disposed within the chamber body opposite the showerhead, one or more heating elements disposed below the susceptor, a first gas ring disposed within the chamber body along the chamber walls and coupled to both the first reactive product and the second reactive product and a second gas ring coupled to the first gas ring, the second gas ring having a plurality of openings therethrough to permit gas to enter the chamber body.

In another embodiment, a method includes inserting a substrate into a processing chamber. The processing chamber has a gas distribution showerhead disposed above a susceptor upon which the substrate is disposed. The processing chamber also has a gas inlet ring disposed in the processing chamber between the gas distribution showerhead and the susceptor. The method may also include heating a first reactive gas remotely from the processing chamber, introducing the first reactive gas into the processing chamber through the gas inlet ring, introducing a second reactive gas to the processing chamber through the gas distribution showerhead and heating the walls of the processing chamber. The method may also include rotating the substrate and depositing a layer on the substrate that is a reactive product of the first reactive gas and the second reactive gas.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments disclosed herein generally relate to an HVPE chamber. The chamber may have one or more precursor sources coupled thereto. When two separate precursor sources are coupled thereto, two separate layers may be deposited. For example, a gallium source and a separate aluminum source may be coupled to the processing chamber to permit gallium nitride and aluminum nitride to be separately deposited onto a substrate in the same processing chamber. In one embodiment, five precursor sources may be coupled to the chamber. Such precursor sources are capable of dispensing precursors such as gallium, indium, aluminum, silicon, and magnesium. When the precursors are used to form a nitrogen containing compound, a nitrogen containing gas such as $NH_3$ may be used. The nitrogen may be introduced to the processing chamber at a separate location from the precursors and at a lower temperature. The geometry of the chamber may be set such that the precursor and the reactive gas are introduced to the chamber separately to avoid high concentration mixing. The chamber inertia is designed to mix the gases by flow, diffusion and convection. In one embodiment, the different temperatures cause the gases to mix together, react and deposit on the substrate with little or no deposition on the chamber walls. In addition, the chamber is equipped with metal oxide source delivery system. In addition, the chamber is equipped with active species generator such as plasma down stream, gas heater, hot wire, etc.

Figure 1:
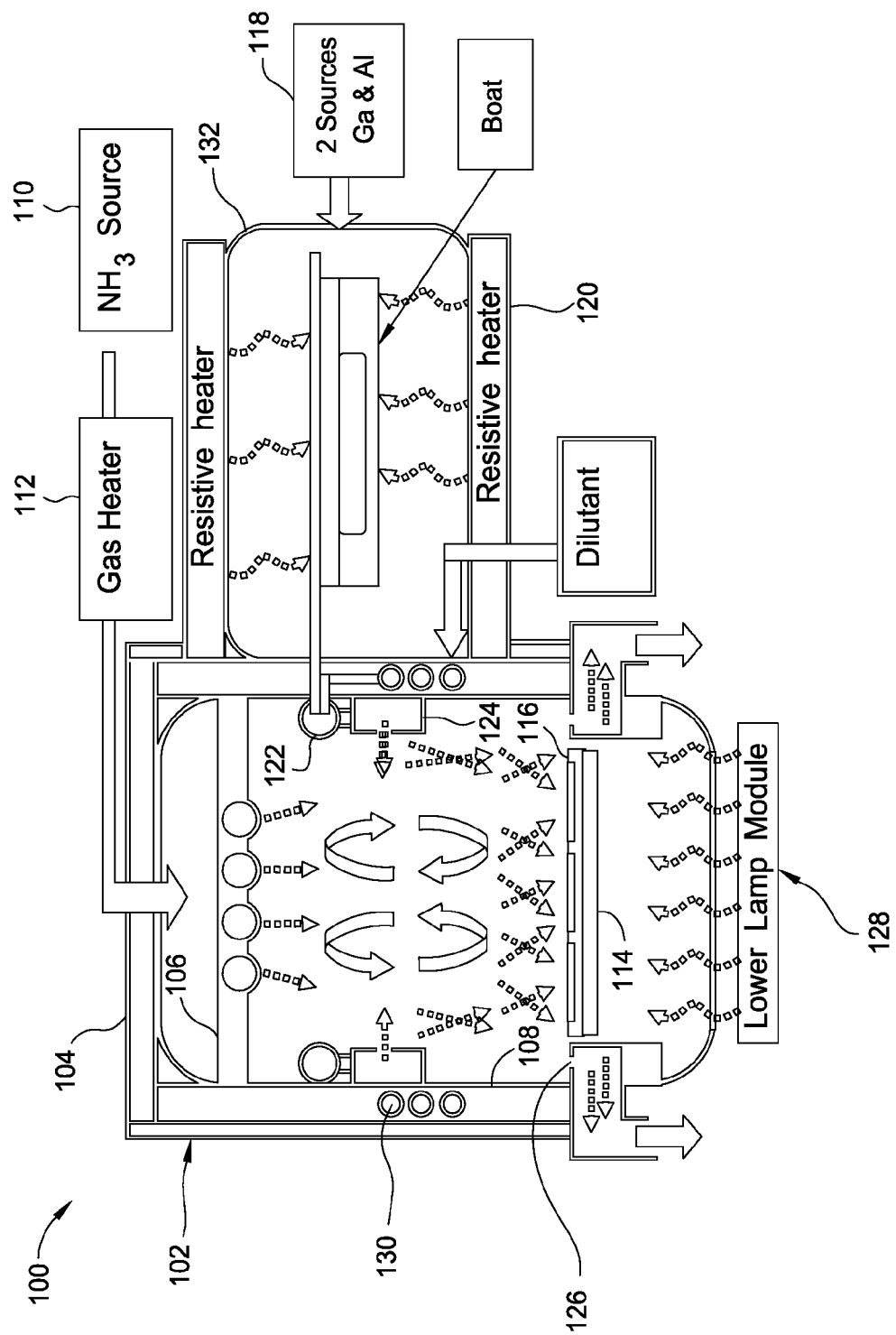
FIG. 1 is a schematic view of an HVPE apparatus 100 according to one embodiment.

FIG. 1 is a schematic view of an HVPE apparatus 100 according to one embodiment. The apparatus includes a chamber 102 enclosed by a lid 104. Processing gas from a first gas source 110 is delivered to the chamber 102 through a gas distribution showerhead 106. In one embodiment, the gas source 110 may comprise a nitrogen containing compound. In another embodiment, the gas source 110 may comprise ammonia. In one embodiment, an inert gas such as helium or diatomic nitrogen may be introduced as well either through the gas distribution showerhead 106 or through the walls 108 of the chamber 102. An energy source 112 may be disposed between the gas source 110 and the gas distribution showerhead 106. In one embodiment, the energy source 112 may comprise a heater. The energy source 112 may break up the gas from the gas source 110, such as ammonia, so that the nitrogen from the nitrogen containing gas is more reactive.

To react with the gas from the first source 110, precursor material may be delivered from one or more second sources 118. The one or more second sources 118 may comprise precursors such as gallium and aluminum. It is to be understood that while reference will be made to two precursors, more or less precursors may be delivered as discussed above. In one embodiment, the precursor comprises gallium present in the precursor source 118 in liquid form. In another embodiment, the precursor comprises aluminum present in the precursor source 118 in solid form. In one embodiment, the aluminum precursor may be in solid, powder form. The precursor may be delivered to the chamber 102 by flowing a reactive gas over and/or through the precursor in the precursor source 118. In one embodiment, the reactive gas may comprise a chlorine containing gas such as diatomic chlorine. The chlorine containing gas may react with the precursor source such as gallium or aluminum to form a chloride. In one embodiment, the one or more second sources 118 may comprise eutectic materials and their alloys. In another embodiment, the HVPE apparatus 100 may be arranged to handle doped sources as well as at least one intrinsic source to control the dopant concentration.

In order to increase the effectiveness of the chlorine containing gas to react with the precursor, the chlorine containing gas may snake through the boat area in the chamber 132 and be heated with the resistive heater 120. By increasing the residence time that the chlorine containing gas is snaked through the chamber 132, the temperature of the chlorine containing gas may be controlled. By increasing the temperature of the chlorine containing gas, the chlorine may react with the precursor faster. In other words, the temperature is a catalyst to the reaction between the chlorine and the precursor.

In order to increase the reactiveness of the precursor, the precursor may be heated by a resistive heater 120 within the second chamber 132 in a boat. For example, in one embodiment, the gallium precursor may be heated to a temperature of between about 750 degrees Celsius to about 850 degrees Celsius. The chloride reaction product may then be delivered to the chamber 102. The reactive chloride product first enters a tube 122 where it evenly distributes within the tube 122. The tube 122 is connected to another tube 124. The chloride reaction product enters the second tube 124 after it has been evenly distributed within the first tube 122. The chloride reaction product then enters into the chamber 102 where it mixes with the nitrogen containing gas to form a nitride layer on the substrate 116 that is disposed on a susceptor 114. In one embodiment, the susceptor 114 may comprise silicon carbide. The nitride layer may comprise gallium nitride or aluminum nitride for example. The other reaction product, such as nitrogen and chlorine, is exhausted through an exhaust 126.

The chamber 102 may have a thermal gradient that can lead to a buoyancy effect. For example, the nitrogen based gas is introduced through the gas distribution showerhead 106 at a temperature between about 450 degrees Celsius and about 550 degrees Celsius. The chamber walls 108 may have a temperature of about 600 degrees Celsius to about 700 degrees Celsius. The susceptor 114 may have a temperature of about 1050 to about 1150 degrees Celsius. Thus, the temperature difference within the chamber 102 may permit the gas to rise within the chamber 102 as it is heated and then fall as it cools. The rising and falling of the gas may cause the nitrogen gas and the chloride gas to mix. Additionally, the buoyancy effect may reduce the amount of gallium nitride or aluminum nitride that deposits on the walls 108 because of the mixing.

The heating of the processing chamber 102 is accomplished by heating the susceptor 114 with a lamp module 128 that is disposed below the susceptor 114. During deposition, the lamp module 128 is the main source of heat for the processing chamber 102. While shown and described as a lamp module 128, it is to be understood that other heating sources may be used. Additional heating of the processing chamber 102 may be accomplished by use of a heater 130 embedded within the walls 108 of the chamber 102. The heater 130 embedded in the walls 108 may provide little if any heat during the deposition process. A thermocouple may be used to measure the temperature inside the processing chamber. Output from the thermocouple may be fed back to a controller that controls the heating of the heater 130 based upon the reading from the thermocouple. For example, if the chamber is too cool, the heater 130 will be turned on. If the chamber is too hot, the heater 130 will be turned off. Additionally, the amount of heating from the heater 130 may be controlled such that a low amount of heat is provided from the heater 130.

After the deposition process, the substrate 116 is normally taken out of the processing chamber 102. The lamp module 128 is turned off. Without the heat from the lamp module 128, the chamber 102 may rapidly cool. The nitrided precursor that may have deposited on the walls 108 may have a different coefficient of thermal expansion than the walls 108 themselves. Thus, the nitrided precursor may flake off due to thermal expansion. To prevent undesired flaking, the heater 130 embedded within the chamber walls 108 may be turned on to control the thermal expansion and maintain the chamber 102 at the desired chamber temperature. The control of the heater 130 may again be based upon real time feedback from the thermocouple. Once the lamp module 128 is turned off, the heater 130 may be turned on or up to maintain the temperature of the chamber 102 at the desired temperature so that nitrided precursor may not flake off and contaminate the substrate or land on the susceptor 114 and create an uneven susceptor 114 surface. By maintaining the chamber walls 108 at an elevated temperature, the cleaning gas, such as chlorine, may be more effective in cleaning the deposits from the chamber walls 108.

In general, a deposition process will proceed as follows. A substrate 116 may initially be inserted into the processing chamber 102 and disposed on the susceptor 114. In one embodiment, the substrate 116 may comprise sapphire. The lamp module 128 may be turned on to heat the substrate 16 and correspondingly the chamber 102. Nitrogen containing reactive gas may be introduced from a first source 110 to the processing chamber. The nitrogen containing gas may pass through an energy source 112 such as a gas heater to bring the nitrogen containing gas into a more reactive state. The nitrogen containing gas then passes through the chamber lid 104 and the gas distribution showerhead 106. In one embodiment, the chamber lid 104 may be water cooled.

A precursor may also be delivered to the chamber 102. A chlorine containing gas may pass through and/or over the precursor in a precursor source 118. The chlorine containing gas then reacts with the precursor to form a chloride. The chloride his heated with a resistive heater 120 in the source module 132 and then delivered into an upper tube 122 where it evenly distributes within the tube 122. The chloride gas then flows down into the other tube 124 before it is introduced into the interior of the chamber 102. It is to be understood that while chlorine containing gas has been discussed, the invention is not to be limited to chlorine containing gas. Rather, other compounds may be used in the HVPE process. The chamber walls 118 may have a minimal amount of heat generated from the heater 130 embedded within the walls 118. The majority of the heat within the chamber 120 is generated by the lamp module 128 below the susceptor 114.

Due to the thermal gradient within the chamber 102, the chloride gas and the nitrogen containing gas rise and fall within the processing chamber 102 and thus intermix to form a nitride compound that is deposited on the substrate 116. In addition to depositing on the substrate 116, the nitride layer may deposit on other exposed areas of the chamber 102 as well. The gaseous reaction product of the chloride compound and the nitrogen containing gas may include chlorine and nitrogen which may be evacuated out of the chamber thought the exhaust 126.

Once the deposition process is completed, the lamp module 128 may be turned off and the heater 130 output may be increased. The substrate 116 may be removed. The heater 130 output reduces or eliminates thermal expansion and thus any deposited nitride material may remain in place until the desired cleaning time and not flake off of the walls 108 and land on the susceptor 114 of incoming/outgoing substrate 116. Once the deposition process is completed, any nitride that has deposited on the walls 108 may be removed by introducing an etchant to etch the nitride off of the walls 108. During the cleaning, the lamp module 128 may be turned off and the majority of the heat may be from the heater 130 embedded within the walls 108. Once a new substrate 116 is placed into the chamber 102, the process may be repeated.

While the nitrogen containing gas is discussed as being introduced through the gas distribution showerhead 106 and the precursor delivered in the area corresponding to the middle of the chamber 102, it is to be understood that the gas introduction locations may be reversed. However, if the precursor is introduced through the showerhead 106, the showerhead 106 may be heated to increase the reactiveness of the chloride reaction product.

Because the chloride reaction product and the ammonia are delivered at different temperatures, delivering the ammonia and the chloride reaction product through a common feed may be problematic. For example, if a quartz showerhead were used to feed both the ammonia and the chloride reaction product, the quartz showerhead may crack due to the different temperatures of the ammonia and the chloride reaction product.

Additionally, the deposition process may involve depositing a thin aluminum nitride layer as a seed layer over the sapphire substrate followed by a gallium nitride layer. Both the gallium nitride and the aluminum nitride may be deposited within the same processing chamber. Thereafter, the sapphire substrate may be removed and placed into an MOCVD processing chamber were another layer may be deposited. In some embodiments, the aluminum nitride layer may be eliminated. Where both an aluminum nitride layer and a gallium nitride layer are deposited within the same chamber, a diatomic nitrogen back flow may be used to prevent any of the other precursors from reacting with chlorine and forming a chloride reaction product. The diatomic nitrogen may be flowed into the chamber of the precursor not being reacted while the chlorine may be flowed into contact with the other precursor. Thus, only one precursor is reacted at a time.

Figure 2:
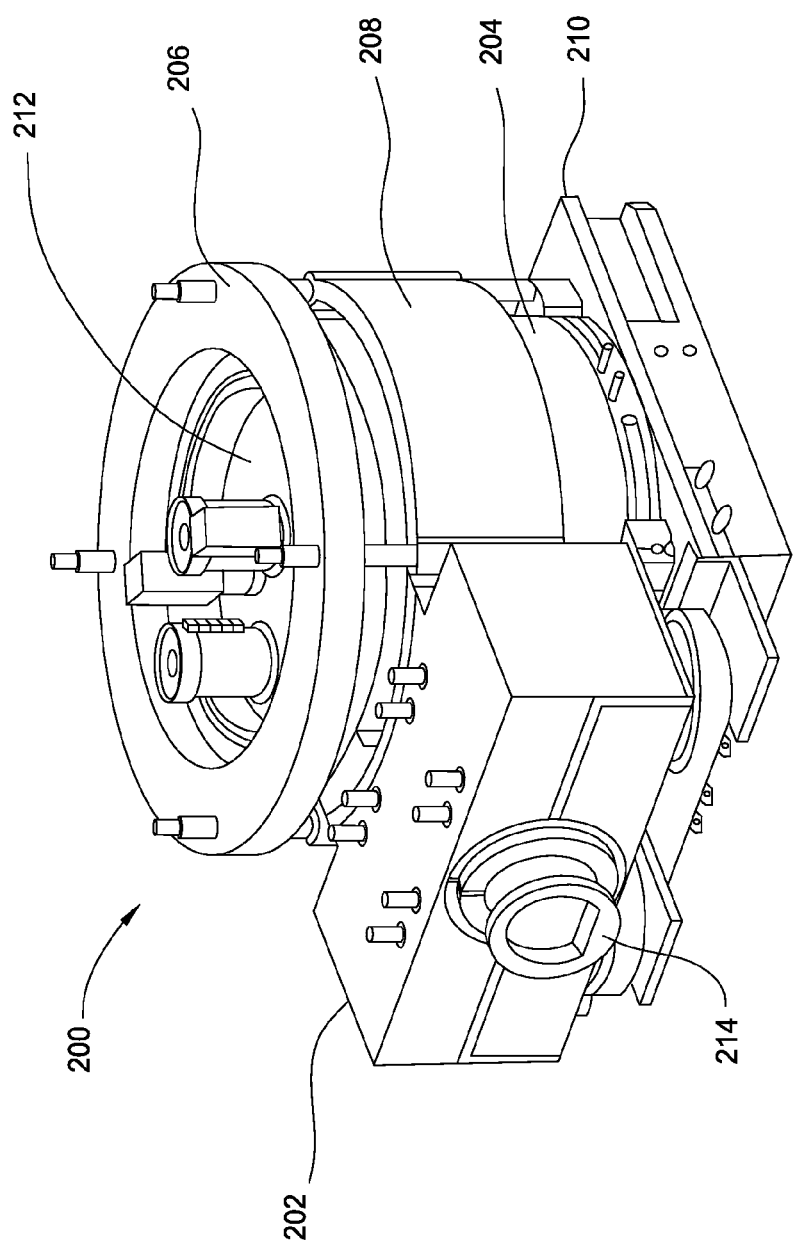
FIG. 2 schematic isometric view of an apparatus 200 according to another embodiment.

FIG. 2 is a schematic isometric view of an apparatus 200 according to another embodiment. The apparatus 200 includes a precursor source 202 or boat that is coupled to the chamber 204. The chamber 204 is enclosed by a lid 212 and held in place by a clamp 206, bottom 210 and enclosure 208. The chlorine containing gas is introduced to the precursor source 202 through a passageway 214. The chlorine containing gas snakes through the passageway 214 prior to coming into contact with the precursor so that the temperature of the chlorine containing gas may be raised to a predetermined temperature suitable to optimally react with the precursor.

Figure 3A:
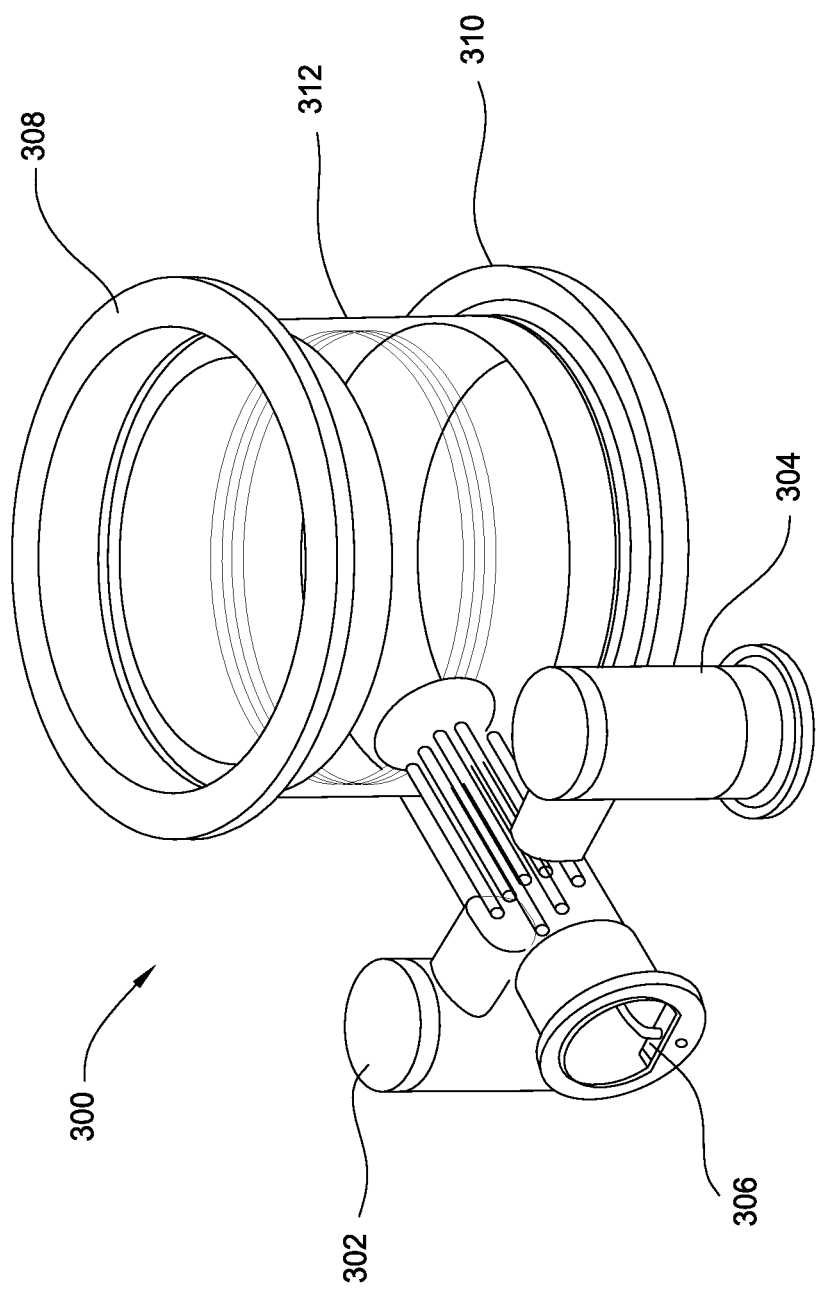
FIG. 3A is a schematic isometric view of a processing chamber 300 according to another embodiment.
Figure 3B:
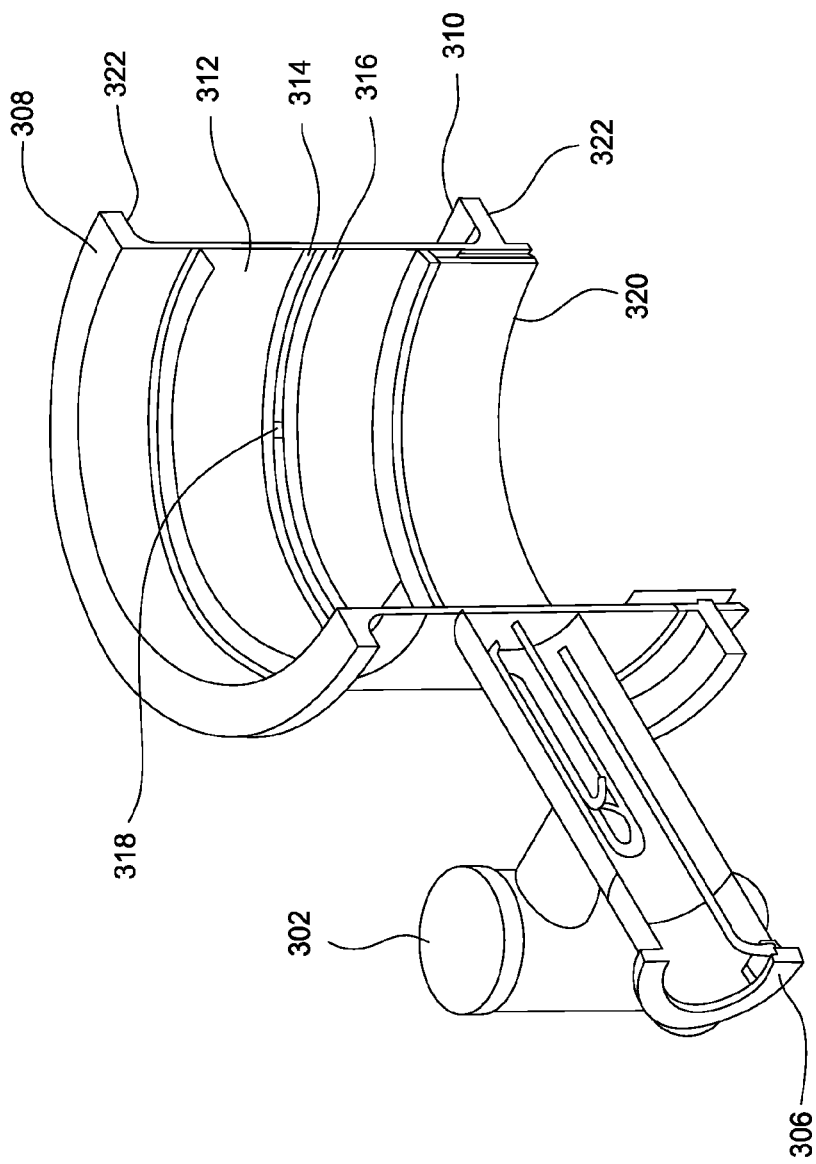
FIG. 3B is a schematic cross sectional view of FIG. 3A.

FIG. 3A is a schematic isometric view of a processing chamber 300 according to another embodiment. The processing chamber 300 includes a first precursor source 302, a second precursor source 304, a passageway 306 for the chlorine gas to pass, an upper ring 308, a lower ring 310, and sidewalls 312. FIG. 3B is a schematic cross sectional view of FIG. 3A. The chloride reaction product may enter the chamber through a first upper tube 314 and then evenly distribute therein before flowing to a second tube 316 through connectors 318 that are distributed between the tubes 314, 316. In one embodiment, a plurality of connectors 318 may be present that are substantially identical. In another embodiment, a plurality of connectors 318 may be present in which at least one connector 318 is different from at least one other connector 318. In another embodiment, a plurality of connectors 318 may be present that are substantially uniformly distributed between the tubes 314, 316. In another embodiment, a plurality of connectors 318 may be present that are non-uniformly distributed between the tubes 314, 316. In one embodiment, the upper and lower rings 308, 310 comprise opaque quartz. In one embodiment, the walls 312 may comprise clear quartz. In another embodiment, the tubes 314, 316 may comprise clear quartz. The lower liner 320 may comprise opaque quartz. The rings 308, 310 may have lips 322 that extend out from the walls 312. O-rings may be disposed out at the edge of the lips 322 to ensure that the O-rings are as far away from the heated chamber walls 312 and lamp module as possible. O-rings typically are usable up until about 250 degrees Celsius. Therefore, moving the O-rings away from the chamber body is beneficial.

Figure 4:
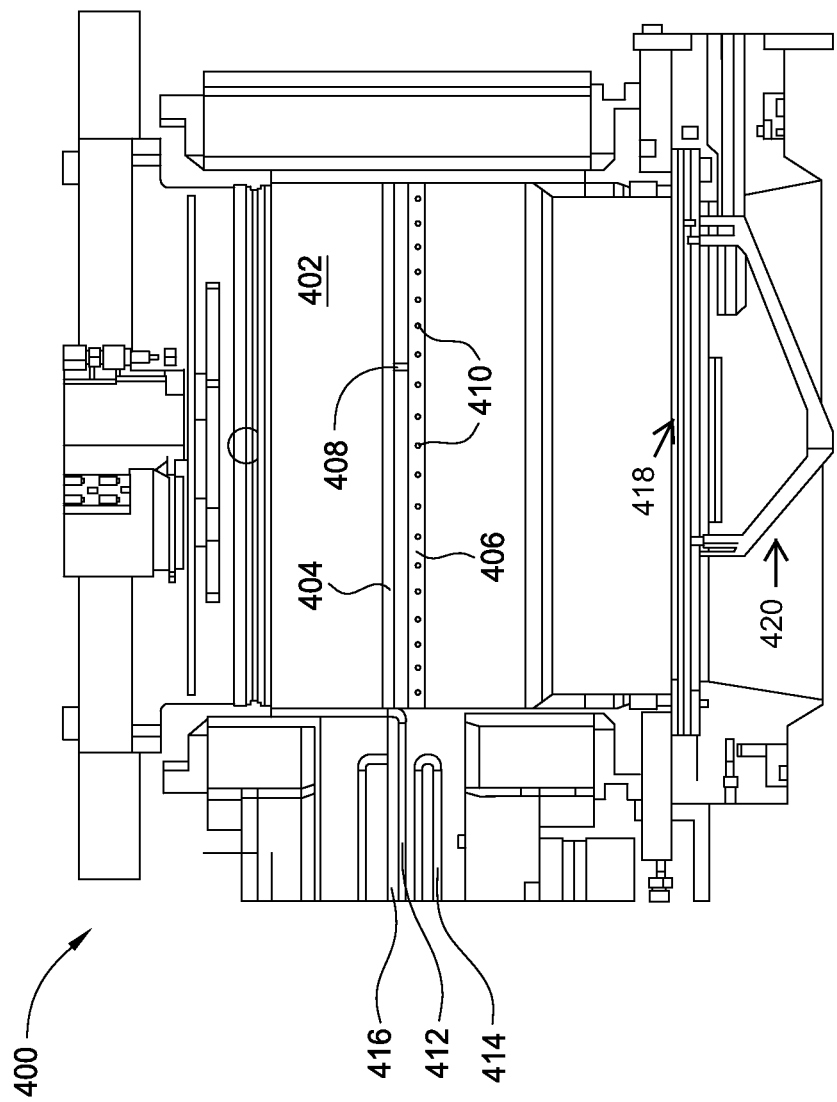
FIG. 4 is a schematic cross sectional view of a processing chamber 400 according to another embodiment.

FIG. 4 is a schematic cross sectional view of a processing chamber 400 according to another embodiment. The processing chamber 400 includes a susceptor 418 supported by a support shaft 420. The processing chamber 400 also includes a chamber wall 402 having a first tube 440 coupled thereto. The first tube 404 is the tube into which the chloride reaction product initially flows before being released into the chamber. The tube 404 is coupled to a second tube 406 via one or more connectors 408. In one embodiment, the one or more connectors 408 may be arranged to substantially balance the flow of the chloride reaction product. In one embodiment, a plurality of connectors 408 may be present that are substantially identical. In another embodiment, a plurality of connectors 408 may be present in which at least one connector 408 is different from at least one other connector 408. In another embodiment, a plurality of connectors 408 may be present that are substantially uniformly distributed between the tubes 404, 406. In another embodiment, a plurality of connectors 408 may be present that are non-uniformly distributed between the tubes 404, 406. The tube 406 has a plurality of openings 410 therethrough to permit the chloride reaction product to enter into the processing space. In one embodiment, the openings 410 may be evenly distributed along the second tube 406. In another embodiment, the openings 410 may be non-uniformly distributed along the second tube 406. In one embodiment, the openings 410 may have a substantially similar size. In another embodiment, the openings 410 may have different sizes. In one embodiment, the openings 410 may face in a direction away from the substrate. In another embodiment, the openings 410 may face in a direction generally towards the substrate. In another embodiment, the openings 410 may face in a direction substantially parallel to the deposition surface of the substrate. In another embodiment, the openings 410 may face in multiple directions. The chloride gas is formed by initially introducing a chlorine containing gas into the precursor source or boat and flowed within the passage 416. The chlorine containing gas snakes around in the passage within tubes 414. The passage 416 is heated by the resistive heaters described above. Thus, the chlorine containing gas increases in temperature before coming into contact with the precursor. Once the chlorine comes into contact with the precursor, a reaction takes place to form a chloride reaction product that is flowed through the passage 416 in gas feed 412 that is coupled to the tube 414. Then, the chloride reaction product is evenly distributed and then disposed into the processing chamber 400.

Figure 5:
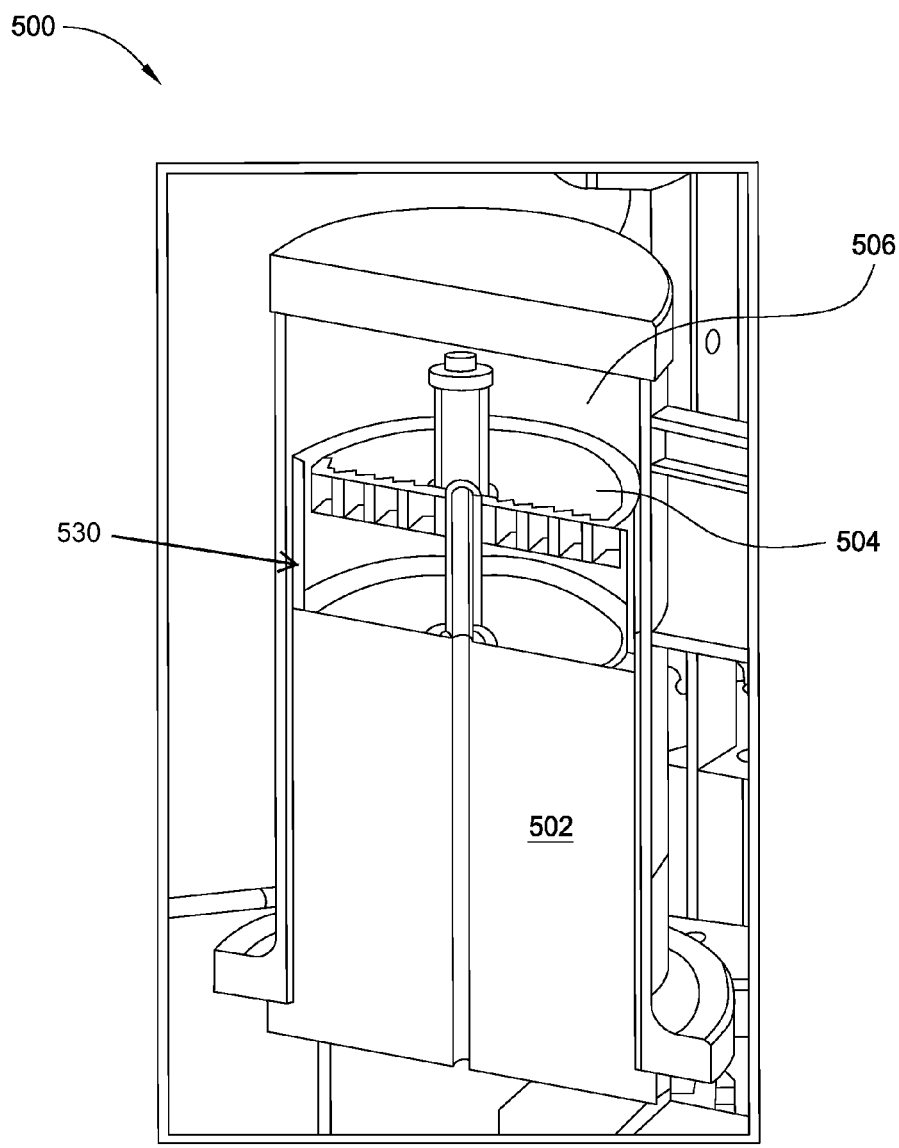
FIG. 5 is a schematic cross sectional view of a precursor source 500 according to one embodiment.

FIG. 5 is a schematic cross sectional view of a precursor source 500 according to one embodiment. In the embodiment discussed herein, the precursor is gallium, however, it is to be understood that the description is applicable to any liquid precursor. The precursor source 500 includes the precursor itself with a float 504 thereon. The float 504 is the item that the chlorine gas flows through to come into contact with the precursor. As the chlorine comes into contact with the precursor, some of the precursor will be used. Thus, the liquid level will drop over time. As such, the float 504 will move down and float on the precursor such that the exposure of chlorine gas to the precursor is substantially the same even as the level of the precursor drops. The area 506 above the float 504 may increase as the precursor 502 decreases. The materials for the float 504 may comprise PbN to eliminate quartz exposure to gallium. The float 504 rests on the precursor which is in a liner 530 that rests on a support liner 502.

Figure 6:
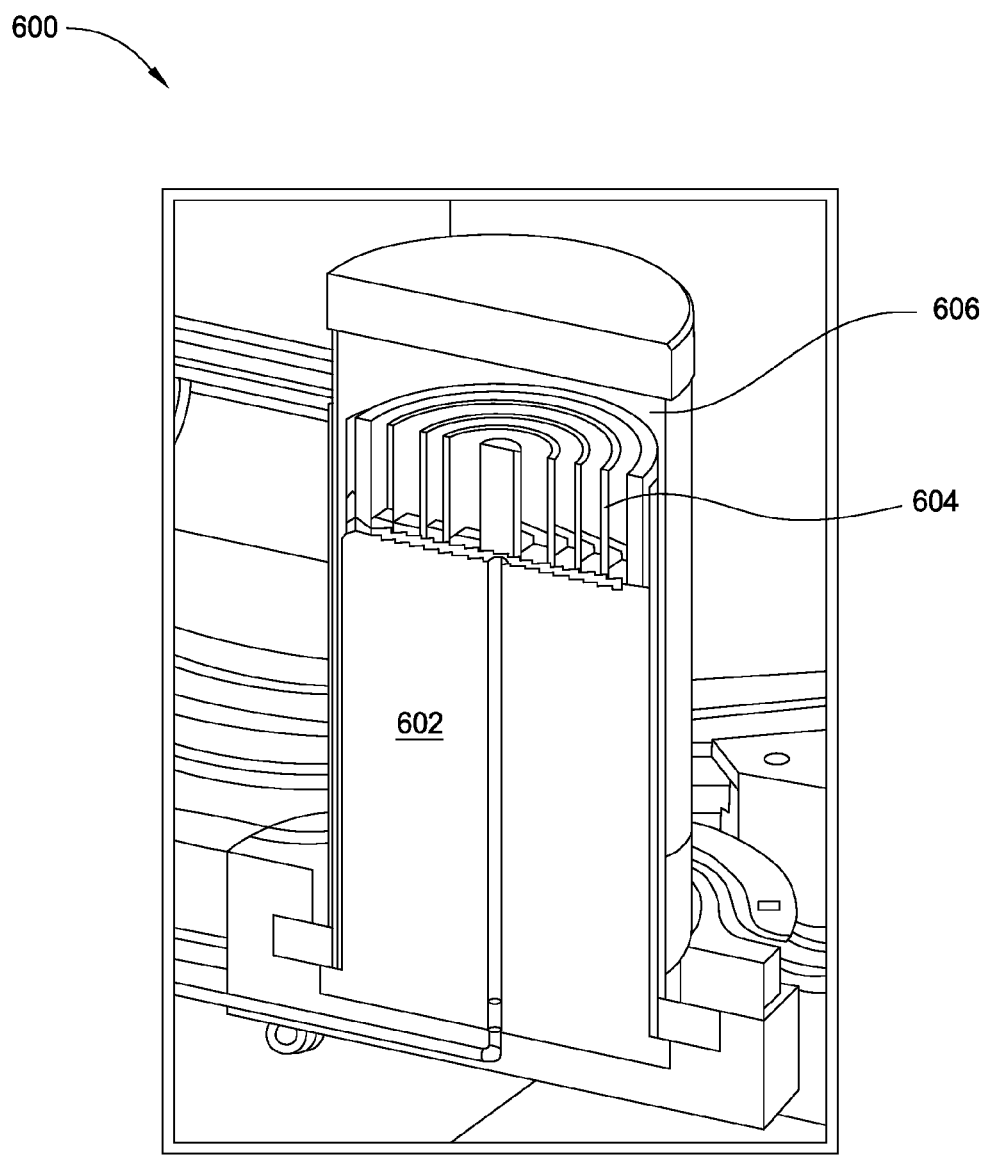
FIG. 6 is a schematic cross sectional view of a precursor source 600 according to another embodiment.

FIG. 6 is a schematic cross sectional view of a precursor source 600 according to another embodiment. While the description will be made with reference to a solid, powder aluminum precursor, it is to be understood that the precursor may be any solid precursor. The precursor is below the showerhead 604 through which the chlorine gas flows to come into contact with the precursor. The showerhead 604 increases the residence time that the chlorine gas is exposed to the precursor so that an optimal amount of precursor may be delivered to the processing chamber. As the showerhead 604 is not a float, the area 606 above the labyrinth 604 is not expected to increase over time. The showerhead 604 rests in a support liner 602.

Figure 7:
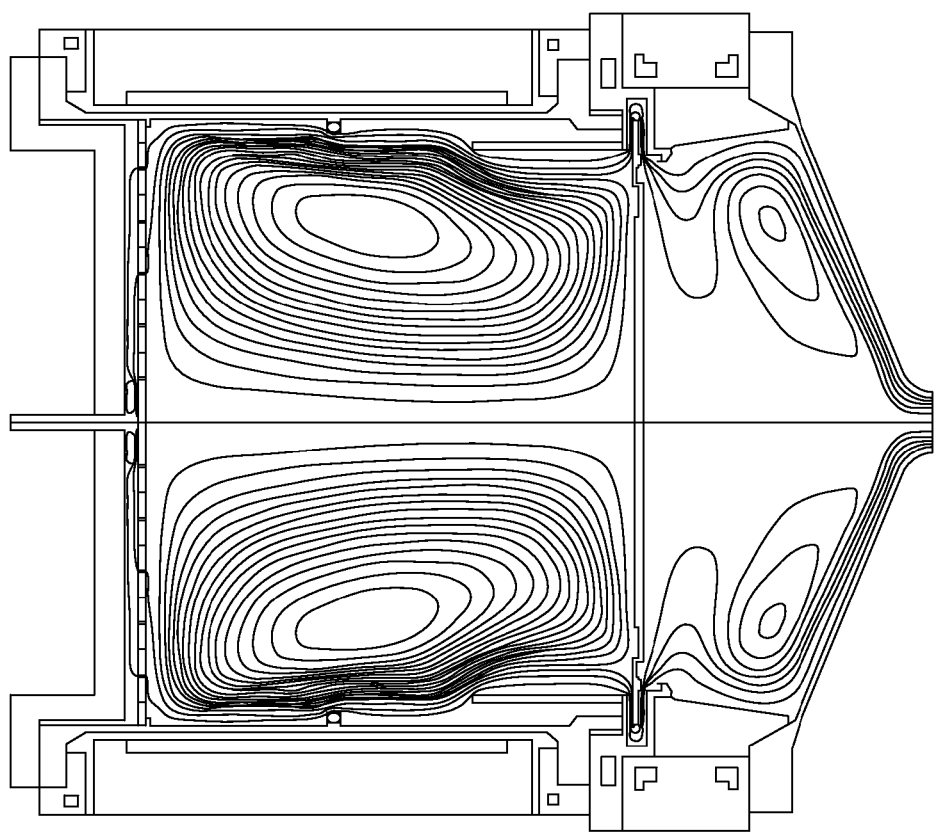
FIG. 7 is a schematic illustration of the buoyancy within the processing chamber according to one embodiment.
Figure 8:
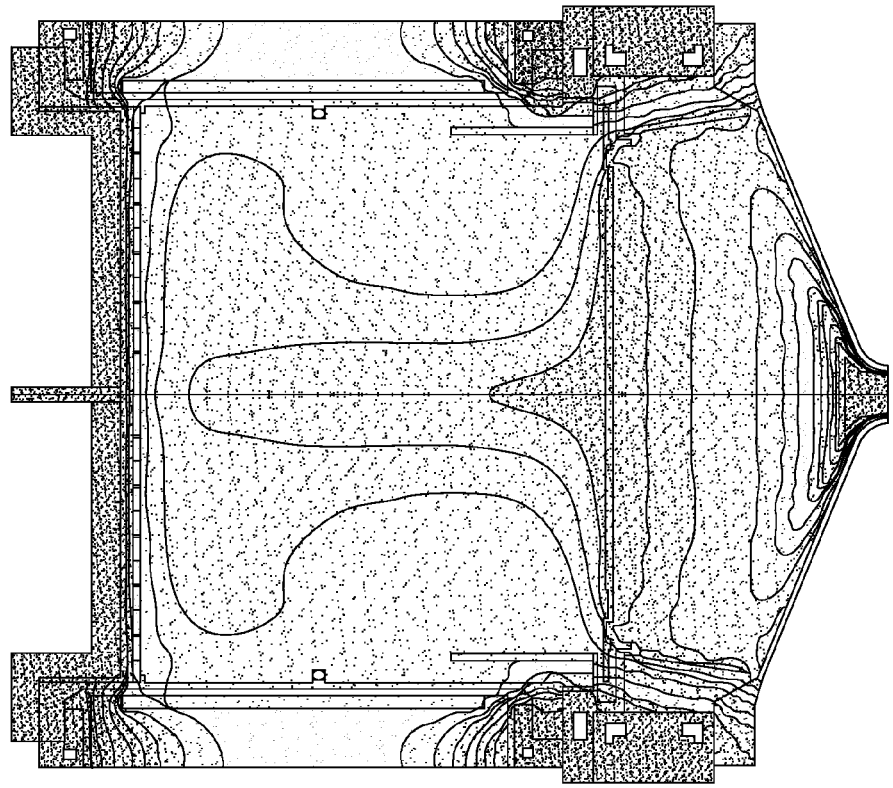
FIG. 8 is a schematic illustration of the heat distribution within the processing chamber according to one embodiment.

FIG. 7 is a schematic illustration of the buoyancy within the processing chamber according to one embodiment. As shown by the lines, the gas flow within the chamber is cyclical such that the gas rises from the bottom of the chamber, mixes, and then sinks towards the bottom of the chamber as the temperature has cooled. FIG. 8 is a schematic illustration of the heat distribution within the processing chamber according to one embodiment. As shown in FIG. 8, the temperature distribution is substantially symmetrical about an axis, but there is a temperature gradient from the bottom of the chamber to the top of the chamber.

The embodiments discussed herein relate to a hot wall HVPE CVD reactor design that minimizes wall deposition while any deposited films adhered to the chamber wall are adhered well enough to manage defects on the product substrate. The chamber is configured such that two reactive gases may be introduced separately at desired preheated temperatures. The gas injection was designed such that the two gases mix mainly away from the wall, but provide enough diffusion length, volume and buoyancy to ensure ideal premixing and produce high quality films.

The chamber design includes a hot wall HVPE reactor with multiple heating zones to manage the wall temperature and gradient, a bottom lamp for fast wafer temperature ramp up and down, a HVPE boat structure that interfaces directly to the chamber interior with optional dilution capabilities, and a chamber structure that promotes buoyancy flow. The chamber design permits a method to inject reactive gases into the main stream of the flow. The chamber design also includes a gas injection method to allow main gas mixing to occur in the gas volume away from the wall, a substrate heater for rapid temperate ramp up and down, a top heater for temperature gradient control, and a gas injection separated such that mixing and buoyancy effect are achieved. The apparatus also includes multiple metal sources heated by an independent heater and control, quartz or ceramic walls that incorporate the showerhead features. Helium may be used instead of nitrogen as the dilution gas to keep the gases at a higher temperature. The top ammonia/nitrogen gas or ammonia/helium gas can be heated to make the ammonia more reactive using a gas heater or heated labyrinth design with multiple plates. The top nitrogen source and the dilutant can be activated by an energy source such as a gas heater. The reactive gas may be flowed over the metal source boat that is preheated or activated with an energy source. The susceptor may be rotated for better gas distribution. A plate may be used to guide the gas mixture to the edge of the substrate. Also, the exhaust may be placed at the peripheral of the substrate or the upper part of the chamber where the heated gas may be exhausted.

While the foregoing is directed to embodiments of the present invention, other and further embodiments of the invention may be devised without departing from the basic scope thereof, and the scope thereof is determined by the claims that follow.

The invention claimed is:

1. An apparatus, comprising:
   a first chamber body and a second chamber body, the first and second chamber bodies having chamber walls;
   a reactive product boat coupled to the second chamber body;
   a first reactive product source disposed within the reactive product boat;
   a second reactive source disposed within the reactive product boat;
   a first heating element coupled to the reactive product boat;
   a third reactive source coupled to the first chamber body and disposed outside of the reactive product boat;
   a second heating element embedded within the chamber walls of the first chamber body;
   a gas distribution element disposed within the first chamber body and coupled with the third reactive source;
   a susceptor disposed within the first chamber body opposite the gas distribution element;
   one or more third heating elements disposed below the susceptor;
   a first gas ring disposed within the first chamber body along the chamber walls peripheral to the susceptor and coupled to both the first reactive product and the second reactive product; and
   a second gas ring coupled to the first gas ring, the second gas ring having a plurality of openings therethrough to permit gas to enter the first chamber body.

2. The apparatus of claim 1, wherein the first chamber body comprises one or more rings that comprise opaque quartz.

3. The apparatus of claim 2, wherein the first chamber body has one or more walls that comprise clear quartz.

4. The apparatus of claim 1, further comprising a chamber lid coupled with the chamber walls of the first chamber body above the gas distribution element, wherein the gas distribution element comprises a gas distribution showerhead.

5. The apparatus of claim 4, wherein the chamber lid comprises quartz.

6. The apparatus of claim 5, wherein the susceptor comprises silicon carbide.

7. The apparatus of claim 6, further comprising a fourth reactive source coupled with both the first reactive source and the second reactive source.

8. The apparatus of claim 7, further comprising an inert gas source coupled with both the first reactive gas source and the second reactive gas source.

9. The apparatus of claim 8, further comprising a vacuum pump coupled with the first chamber body at a location below the susceptor.

10. The apparatus of claim 9, wherein the first gas tube and the second gas tube each comprise clear quartz.

11. The apparatus of claim 10, wherein the apparatus is a hydride vapor phase epitaxy apparatus.

* * * * *